United States Patent
Kim et al.

(10) Patent No.: US 8,223,311 B2
(45) Date of Patent: Jul. 17, 2012

(54) LIQUID CRYSTAL DISPLAY DEVICE INCLUDING AIRFLOW CHANNEL

(75) Inventors: Jin Sub Kim, Seongnamn-si (KR); Jin Hyun Cho, Seoul (KR); Sung Ki Kim, Seoul (KR); Joon Kang, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 424 days.

(21) Appl. No.: 12/478,832

(22) Filed: Jun. 5, 2009

(65) Prior Publication Data

US 2009/0310059 A1 Dec. 17, 2009

(30) Foreign Application Priority Data

Jun. 13, 2008 (KR) ........................ 10-2008-0055687

(51) Int. Cl.
  *G02F 1/1333* (2006.01)
  *G02F 1/133* (2006.01)
(52) U.S. Cl. ............................. 349/161; 349/58; 349/72
(58) Field of Classification Search .................. 349/161, 349/72, 58
See application file for complete search history.

(56) References Cited

U.S. PATENT DOCUMENTS

| | | | |
|---|---|---|---|
| 5,682,216 A | 10/1997 | Lin et al. | |
| 7,157,838 B2 * | 1/2007 | Thielemans et al. | 313/35 |
| 2007/0058339 A1 | 3/2007 | Hoffman et al. | |
| 2007/0081344 A1 * | 4/2007 | Cappaert et al. | 362/373 |

FOREIGN PATENT DOCUMENTS

| | | |
|---|---|---|
| EP | 1 253 459 | 10/2002 |
| JP | 2007-183436 | 7/2007 |
| WO | 03/075081 | 9/2003 |
| WO | 2005/079129 | 8/2005 |
| WO | WO 2005/079129 A1 * | 8/2005 |

OTHER PUBLICATIONS

Extended European Search Report issued in European Patent Application No. 09162240.7 on Jul. 22, 2011.

\* cited by examiner

*Primary Examiner* — Mike Qi
(74) *Attorney, Agent, or Firm* — Stanzione & Kim, LLP

(57) ABSTRACT

A liquid crystal display device includes a liquid crystal panel, a protection panel arranged a predetermined distant from the liquid crystal panel, and a flow control device to impart turbulence to an air flow in a channel, which is defined between the liquid crystal panel and the protection panel.

15 Claims, 10 Drawing Sheets

FIG. 4 d = 0.004 m

| SOLAR RADIATION [W/m²] | FLOW VELOCITY IN CHANNEL [m/s] | | | | | |
|---|---|---|---|---|---|---|
| | 5 | 8 | 10 | 12 | 14 | 16 |
| 600 | 84.5 | 70.6 | 65.8 | 62.6 | 60.3 | 58.5 |
| 850 | 101 | 81.2 | 74.5 | 69.9 | 66.6 | 64.1 |
| 1100 | 117.5 | 91.9 | 83.1 | 77.2 | 73 | 69.7 |

FIG. 5 d = 0.005 m

| SOLAR RADIATION [W/m²] | FLOW VELOCITY IN CHANNEL [m/s] | | | | | |
|---|---|---|---|---|---|---|
| | 4 | 6 | 8 | 10 | 12 | 14 |
| 600 | 88 | 74.7 | 67.8 | 63.6 | 60.8 | 58.7 |
| 850 | 105.9 | 87 | 77.3 | 71.4 | 67.3 | 64.4 |
| 1100 | 123.9 | 99.4 | 86.8 | 79.1 | 73.9 | 70 |

FIG. 6 d = 0.025 m

| SOLAR RADIATION [W/m²] | FLOW VELOCITY IN CHANNEL [m/s] | | | | |
|---|---|---|---|---|---|
| | 3 | 4 | 6 | 8 | 10 |
| 600 | 82 | 74.1 | 65.7 | 61.3 | 58.6 |
| 850 | 97.4 | 86.2 | 74.4 | 68.1 | 64.2 |
| 1100 | 112.8 | 98.3 | 83 | 74.9 | 69.9 |

FIG. 7 d = 0.03 m

| SOLAR RADIATION [W/m²] | FLOW VELOCITY IN CHANNEL [m/s] | | | | |
|---|---|---|---|---|---|
| | 3 | 4 | 6 | 8 | 10 |
| 600 | 82 | 74.1 | 65.8 | 61.4 | 58.7 |
| 850 | 97.4 | 86.3 | 74.5 | 68.3 | 64.3 |
| 1100 | 112.8 | 98.4 | 83.2 | 75.1 | 70 |

FIG. 9

| FLOW VELOCITY, V [m/s] | SPACING DISTANCE, d [m] | | | | |
|---|---|---|---|---|---|
| | 0.005 | 0.01 | 0.015 | 0.02 | 0.025 |
| 1 | 629 | 1259 | 1888 | 2517 | 3147 |
| 2 | 1259 | 2517 | 3776 | 5035 | 6293 |
| 3 | 1888 | 3776 | 5664 | 7552 | 9440 |
| 4 | 2517 | 5035 | 7552 | 10069 | 12587 |
| 5 | 3147 | 6293 | 9440 | 12587 | 15733 |
| 6 | 3776 | 7552 | 11328 | 15104 | 18880 |

LIQUID CRYSTAL DISPLAY DEVICE INCLUDING AIRFLOW CHANNEL

CROSS-REFERENCE TO RELATED APPLICATIONS

This application claims priority under 35 U.S.C. §119(a) from Korean Patent Application No. 2008-0055687, filed on Jun. 13, 2008 in the Korean Intellectual Property Office, the disclosure of which is incorporated herein in its entirety by reference.

BACKGROUND OF THE INVENTION

1. Field of the Invention

The present general inventive concept relates to a liquid crystal display device, and, more particularly, to a liquid crystal display device with a heat dissipation structure to cool a liquid panel of the device.

2. Description of the Related Art

Liquid crystal display (LCD) devices are widely used in display applications such as displays of meters for automobiles and/or construction equipment, laptop computers, mobile phones, TVs, etc.

An LCD device generally includes a liquid crystal panel and a backlight unit (BLU) to apply light to a rear side of the liquid crystal panel. The liquid crystal panel consists of a pair of substrates which face each other with a liquid crystal layer interposed therebetween. The backlight unit includes a light source to emit the light to the liquid crystal panel. Such light source may include a cold cathode fluorescent tube, a light emitting diode (LED), and the like.

The light source in the backlight unit not only emits light but also generates heat to cause degradation of liquid crystals. Therefore, the LCD device must include a heat dissipation element to discharge or release the heat generated by the light source. The heat dissipation element is typically located at a rear side relative to the liquid crystal panel, such that this releases the heat generated from the BLU mounted on the rear side of the liquid crystal panel.

Thus, when the LCD device is used outdoors, a front side of the liquid crystal panel is exposed to sunlight, leading to an increase in temperature and degradation of the panel. Accordingly, the LCD device must only be used in a limited place, such as a room. That is, conventional LCD devices are not applicable to outdoor billboards to which sunlight energy is incident for long periods of time.

In order to solve the problems described above due to limitations and disadvantages of the related art, the present general inventive concept is directed an LCD device with a heat dissipation structure to remove or release heat incident on a front side of a liquid crystal panel.

SUMMARY OF THE INVENTION

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a liquid crystal display (LCD) device including a liquid crystal panel, a protection panel arranged a predetermined distance from the liquid crystal panel, and a flow control device to impart turbulence to an air flow in a channel, which is defined between the liquid crystal panel and the protection panel.

The flow control device may be a cooling fan to blow air to the channel.

The flow control device may also include a temperature sensor to detect a temperature of air having passed through the channel, and a flow rate controller to regulate a flow rate of the air blown from the cooling fan.

The flow control device may regulate a flow rate of air in the cooling fan, which in turn, controls a flow velocity of air in the channel in a range of 4 m/s to 14 m/s.

The channel may be defined between the liquid crystal panel and the protection panel and has a spacing distance in a range of 5 to 25 mm.

The channel may be an air inlet to receive air and an air outlet to discharge the received air from the channel. The cooling fan may be located near the air inlet.

Each of the air inlet and the air outlet may be provided with a dust filter to remove foreign matter from the air.

The LCD device may include a backlight unit and a circuit board, both provided at the rear side of the liquid crystal panel, and a rear panel spaced apart from the backlight unit and the circuit board. The air passing through the channel, which is defined between the protection panel and the liquid crystal panel, may flow via another channel formed by the backlight unit and the circuit board so as to remove heat generated from the backlight unit and the circuit board.

The foregoing and/or other aspects and utilities of the general inventive concept may also be achieved by providing a liquid crystal display (LCD) including a liquid crystal panel, a protection panel arranged a predetermined distance from the liquid crystal panel, and a flow control device to detect a variation in temperature caused by heat incident on the front side of the liquid crystal panel, and to control a flow rate of the air blowing toward a channel, which is defined between the liquid crystal panel and the protection panel.

The flow control device may have a flow rate controller to regulate the flow rate of the air such that air in the channel has a flow velocity of not less than 4 m/s when the channel defined between the liquid crystal panel and the protection panel has a spacing distance in the range of 5 to 25 mm.

The flow control device may also have a temperature sensor to detect a temperature variation of the air having passed through the channel. The flow rate controller is operated by a signal transmitted from the temperature sensor.

The foregoing and/or other aspects and utilities of the general inventive concept may also be achieved by providing a liquid crystal display (LCD) device including a housing partitioned into upper and lower spaces, a liquid crystal panel assembly arranged in the upper space, and an air conditioner arranged in the lower space to blow air to the liquid crystal assembly to cool the liquid crystal assembly.

The LCD device may also include a flow control device to impart turbulence to air blowing toward the liquid crystal panel assembly and, thus, to cool the liquid crystal panel assembly.

The housing may include a protection panel formed at the front side thereof, and the air conditioner has a cooling fan to blow the air to a channel formed by the protection panel and the liquid crystal panel assembly.

The flow control device may also have a flow rate controller to regulate a flow rate of the air blown from the cooling fan such that the air in the channel has a controlled flow velocity.

The channel may be formed in a space between the liquid crystal panel assembly and the protection panel by a spacing distance in the range of 0.005 to 0.025 m (that is, 5 to 25 mm). The flow rate controller regulates the flow rate of the air in the cooling fan such that the flow velocity of air in the channel may be maintained at 4 m/s or more.

The flow control device may also include a temperature sensor to measure a temperature of the air having passed through the channel, and to send a resulting signal to the flow rate controller.

The flow rate controller may control the cooling fan such that the flow velocity of the air in the channel may be maintained at 14 m/s or less.

The liquid crystal panel assembly includes a liquid crystal panel, a backlight unit to irradiate light to the liquid crystal panel, and a circuit board to control the liquid crystal panel and the backlight unit.

The foregoing and/or other aspects and utilities of the general inventive concept may also be achieved by providing a display device including a liquid crystal panel to display an image, a protection panel to protect the liquid crystal panel, and a channel formed between the liquid crystal panel and the protection panel to pass air therebetween to remove heat from a front side of the liquid crystal panel, wherein a distance between the liquid crystal panel and the protection panel is in a range of 5 mm to 25 mm.

The foregoing and/or other aspects and utilities of the general inventive concept may also be achieved by providing a display device including a liquid crystal panel to display an image, a protection panel to protect the liquid crystal panel, a channel formed between the liquid crystal panel and the protection panel, and a flow control device to provide turbulent air in the channel to remove heat from a front side of the liquid crystal panel.

The flow control device may include a cooling fan to blow the air to the first channel, a flow rate controller to regulate a flow rate of air in the cooling fan to control a flow velocity of the air in the channel, and a temperature sensor to measure temperature of the air having passed through the first channel, and to send a resulting signal to the flow rate controller.

A distance between the liquid crystal panel and the protection panel may be determined by a static pressure-flow rate curve of the cooling fan.

The foregoing and/or other aspects and utilities of the general inventive concept may also be achieved by providing a display device including a housing a display assembly disposed inside the housing and spaced apart from the housing to form front, top, and rear air flow channels in order.

The display device may further include a flow control device to generate an air flow to flow air through the front, top and rear air channels in order.

The flow control device may include an air conditioner to generate a cooling air as the air flows.

Each of the LCD devices with the constructions described above according to the present general inventive concept has an advantage of not being degraded even when used outdoors and, therefore, is effectively applicable regardless of location.

Furthermore, the cooling fan in the LCD device of the present general inventive concept can be controlled depending on the outdoor environments, thereby possibly reducing electric power consumption.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 4 illustrates a table for maximum temperatures of a liquid crystal with respect to solar radiation at an outdoor temperature of 45° C. and flow velocity of air in a first channel, when the first channel is formed at a spacing distance of 0.004 m;

FIG. 5 illustrates a table for maximum temperatures of a liquid crystal with respect to solar radiation at an outdoor temperature of 45° C. and flow velocity of air in a first channel, when the first channel is formed at a spacing distance of 0.005 m;

FIG. 6 illustrates a table for maximum temperatures of a liquid crystal with respect to solar radiation at an outdoor temperature of 45° C. and flow velocity of air in a first channel, when the first channel is formed at a spacing distance of 0.025 m;

FIG. 7 illustrates a table for maximum temperatures of a liquid crystal with respect to solar radiation at an outdoor temperature of 45° C. and flow velocity of air in a first channel, when the first channel is formed at a spacing distance of 0.03 m;

FIG. 9 illustrates a table for Reynolds numbers with respect to different flow velocities of air in a first channel depending on a spacing distance of the same.

DETAILED DESCRIPTION OF THE PREFERRED EMBODIMENTS

Figure 1:
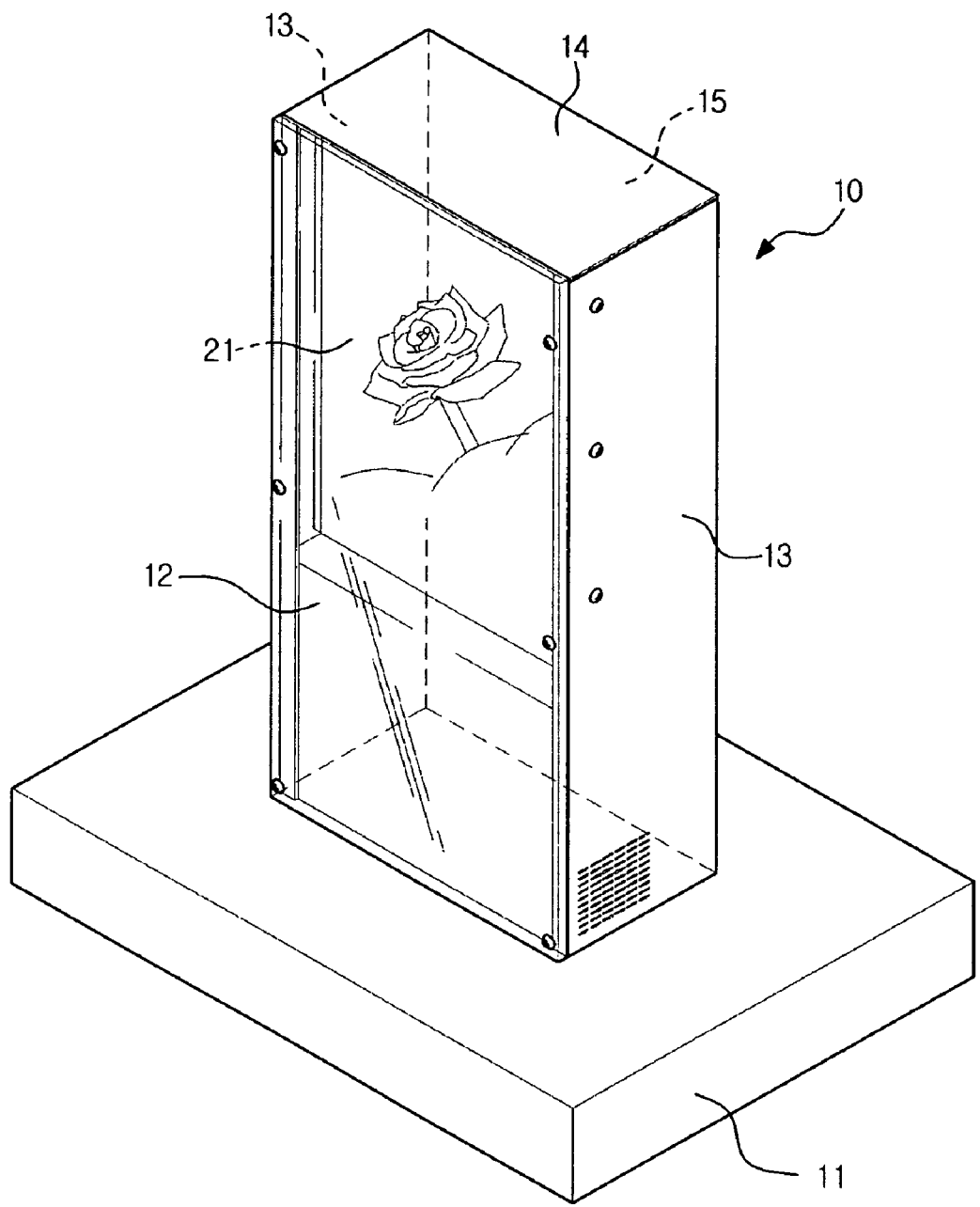
FIG. 1 is a perspective view illustrating a liquid crystal display device according to an embodiment of the present general inventive concept.

Reference will now be made in detail to embodiments of the present general inventive concept, examples of which are illustrated in the accompanying drawings, wherein like reference numerals refer to the like elements throughout. The embodiments are described below to explain the present general inventive concept by referring to the figures.

A description will be given of an exemplary embodiment of the present general inventive concept with reference to FIGS. 1 to 3.

FIG. 1 is a perspective view illustrating a liquid crystal display device according to the exemplary embodiment of the present general inventive concept. A display device, such as a flat display panel or a PDP apparatus, can be used as the liquid crystal display device.

As illustrated in FIG. 1, the liquid crystal display device includes a housing 10 and a bottom plate 11 arranged beneath the housing 10 to support the same. The housing 10 includes two opposite side panels 13, a top panel 14 to join the side panels 13, a protection panel 12 provided at a front side of the housing 10, and a rear panel 15 provided at a rear side of the housing 10. The housing 10 is equipped with an LCD assembly 20 having a liquid crystal panel 21 therein. The protection panel 12 may be prepared using a transparent material such as glass such that an image displayed by the liquid crystal panel 21 (as illustrated in FIG. 2) can be viewed outside the housing 10.

Figure 2:
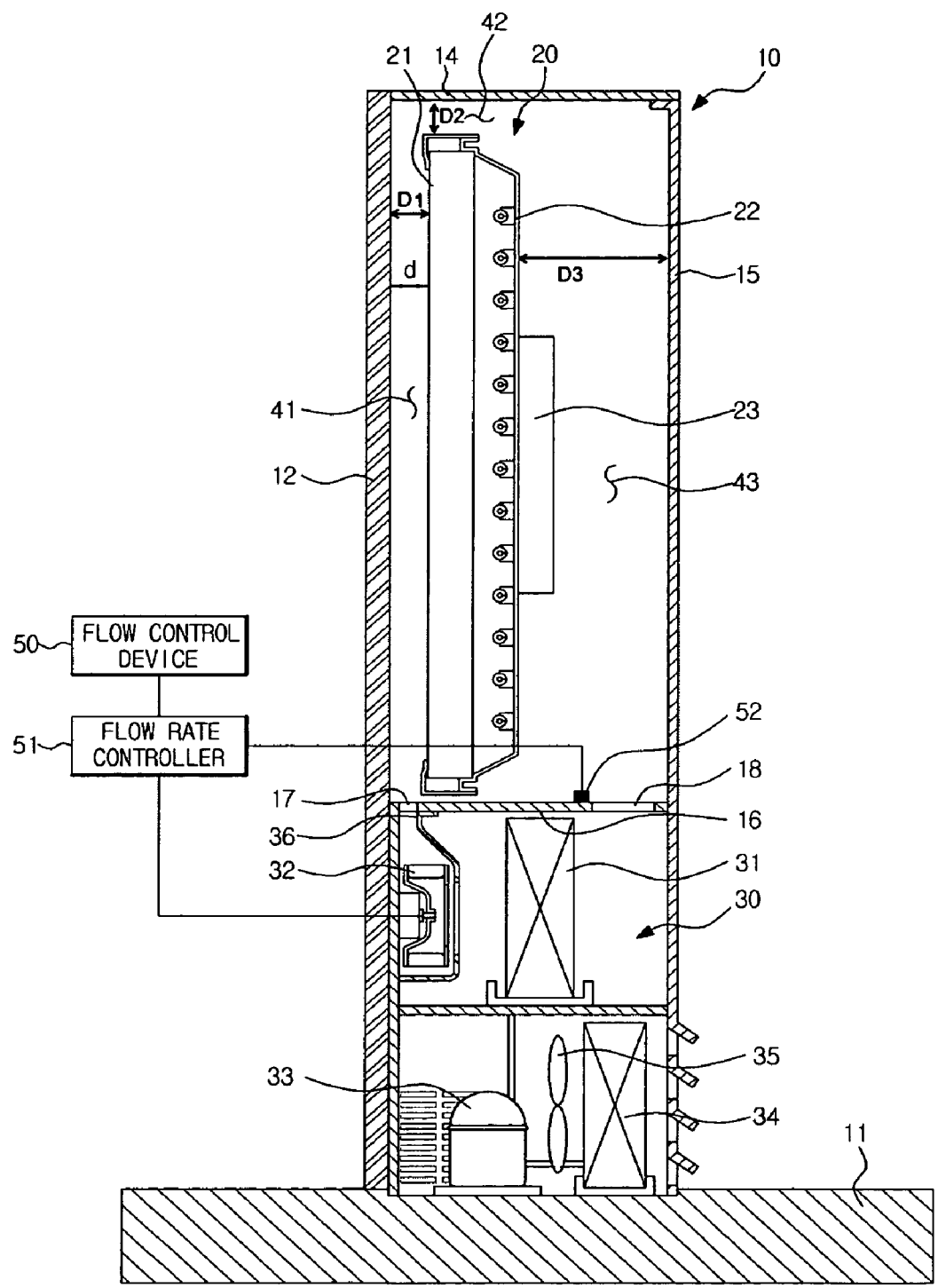
FIG. 2 is a side cross-sectional view illustrating the liquid crystal display device of FIG. 1.
Figure 3:
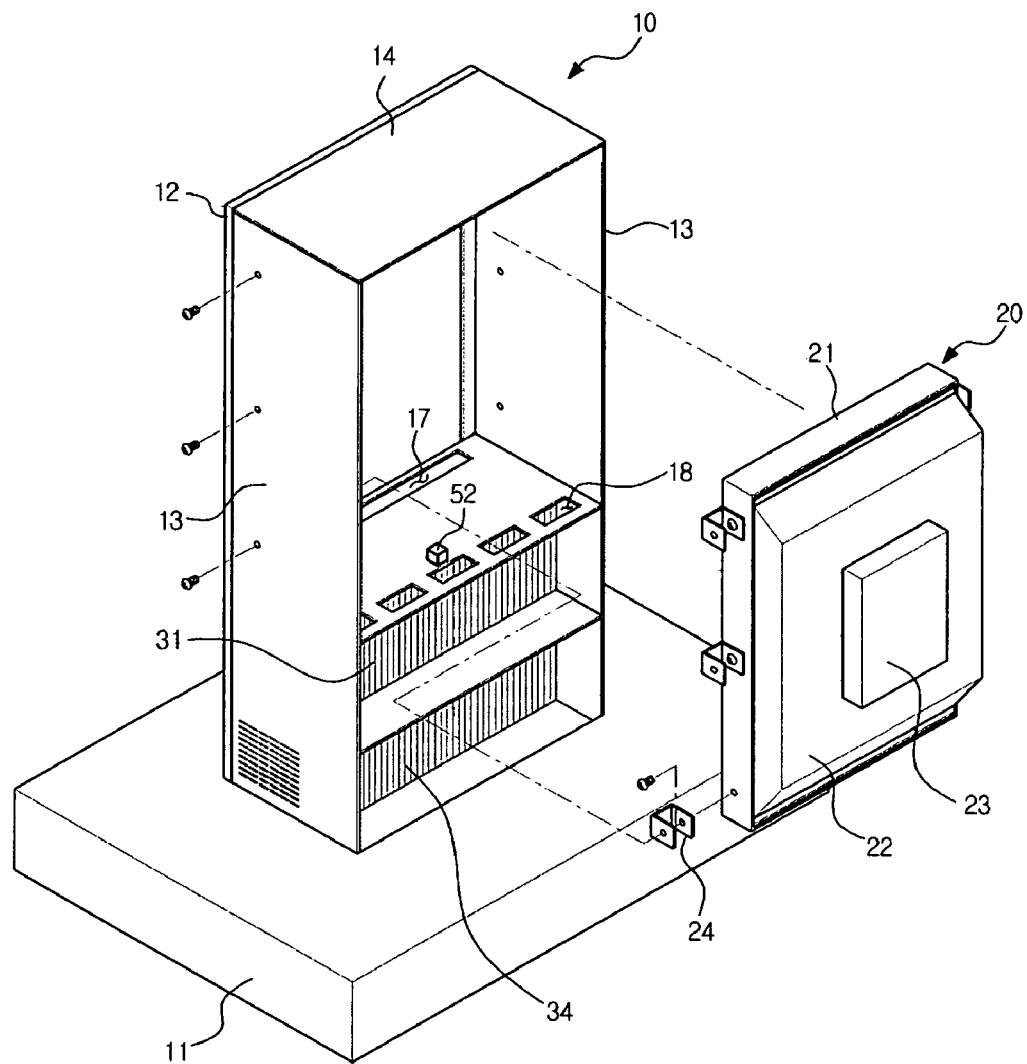
FIG. 3 is a rear side view illustrating the liquid crystal display device of FIG. 1.

FIG. 2 is a side cross-sectional view and FIG. 3 is a rear perspective view illustrating the liquid crystal display device illustrated in FIG. 1.

As illustrated in FIGS. 2 and 3, the housing 10 is partitioned into upper and lower spaces by a partition 16 built in the housing. There is a liquid crystal panel assembly 20 in the upper space while an air conditioner 30 is arranged in the lower space. A display panel assembly, such as a flat display assembly or a PDP assembly, can be used as the LCD assembly 20. The liquid crystal panel 21 which displays an image is included in the liquid crystal panel assembly 20. The liquid crystal panel assembly 20 also includes a backlight unit 22 located at a rear side of the liquid crystal panel 21 to irradiate light thereto, and a circuit board 23 located at a rear side of the backlight unit 22 to control operation of the liquid crystal panel 21 and the backlight light 22. The air conditioner 30 includes an evaporator 31 and a cooling fan at an upper portion thereof, as well as a compressor 33, a condenser 34 and an air blowing fan 35 at a lower portion thereof.

The liquid crystal panel assembly 20 is disposed such that the liquid crystal panel assembly 20 is spaced apart from the protection panel 12 at the front side of the housing 10. The liquid crystal panel assembly 20 is also spaced apart from the rear panel 15 at the rear side of the housing 10. The liquid crystal panel assembly 20 is also spaced from the top panel 14 of the housing 10. Accordingly, air in the housing 10 can pass through a first channel 41 defined between the liquid crystal panel assembly 20 and the protection panel 12, a second channel 42 defined between the liquid crystal panel assembly 20 and the top panel 14 of the housing 10, and a third channel 43 defined between the liquid crystal panel 20 and the rear panel 15. The first channel 41 has a first distance D1, the second channel 42 has a second distance D2, and the third channel 43 has a third distance D3. The third distance D3 may be different from the first distance D1 and the second distance D2.

The partition 16 has an air outlet 18 at a rear portion thereof such that the upper space and lower spaces of the housing 10 can communicate with each other. Therefore, the air in the third channel 43 can move toward the evaporator 31. The partition 16 also has an air inlet 17 at a front portion thereof such that the upper and lower spaces of the housing 10 communicate with each other. As a result, air blown from the cooling fan 32 can move to the first channel 41.

The cooling fan 32 has an exit 36 arranged at the air inlet 17 where air emerging from the exit 36 passes through the first channel 41. Therefore, the air blown toward the first channel 41 by the cooling fan 32 is maintained at a relatively low temperature because it has already passed through the evaporator 31. Accordingly, the air blown toward the first channel 41 by the cooling fan 32 removes heat incident on the front side of the liquid crystal panel 21 and cools the liquid crystal panel 21 while passing through the first channel 41. The heat incident on the front side of the liquid crystal panel 21 may include solar radiation, heat transfer caused by a variation in ambient temperature, and the like. After passing through the first channel 41, the air passes through the second and third channels 42 and 43 in this order. In particular, the air passing through the third channel 43 removes heat generated from the backlight unit 22 and the circuit board 23. After emerging from the third channel 43, the air is cooled again while passing through the evaporator 31.

An air flow process in the housing 10 will be described in detail below: the cooled air having passed through the evaporator 31 passes through the air inlet 17 by the cooling fan 32. Next, the air sequentially passes through the first, second and third channels 41, 42 and 43. Herein, the air removes the heat incident on the front side of the liquid crystal panel 21 while passing through the first channel 41 as well as the heat generated from the backlight unit 22 and the circuit board 23 during passage through the third channel 43. Following this, the air returns to the evaporator 31 through the air outlet 18.

As is apparent from the description disclosed above, in the liquid crystal display device of the present general inventive concept, the liquid crystal panel assembly 20 is disposed in the upper space and the air conditioner 30 is disposed in the lower space of the housing 10, so that the air conditioner 30 can cool the liquid crystal panel assembly 20. However, when the liquid crystal display device is located outside and is continuously exposed to solar radiation and, when the external temperature increases in the summer, the front side of the liquid crystal panel 21 is heated and leads to a rapid increase in temperature of liquid crystals in the panel, which in turn, results in degradation of liquid crystals. Therefore, a method may be devised that improves performance of the air conditioner 30 to decrease the temperature of air blowing toward the first channel 41 to prevent degradation of liquid crystals. However, in order to improve the performance of the air conditioner 30, the air conditioner 30 must be enlarged, which may result in increased manufacturing costs. Consequently, in consideration of various requirements and manufacturing costs that inhibit the liquid crystal display device from being infinitely enlarged, another approach to prevent degradation of liquid crystals is still required.

The LCD device of the present general inventive concept is configured such that the air passing through the first channel 41 can sufficiently absorb the heat incident on the front side of the liquid crystal panel 21, taking into consideration the fact that the degradation of liquid crystals occurs due to the heat incident on the front side of the liquid crystal panel 21. Thus, if the air passing through the first channel 41 is turbulent, the turbulent air flow can considerably remove the heat incident on the front side of the liquid crystal panel 21, compared to a laminar flow. One reason for this is presumed to be because the turbulent air flow has greater inertia than the laminar flow to induce a variation of velocity over time, therefore, this abnormal flow accelerates mixing in a boundary layer, resulting in improved momentum and heat transfer performance.

Hereinafter, a description will be given of a spacing distance "d" of the first channel 41 to generate a turbulent air flow in the first channel 41 and the flow velocity of air blown toward the first channel 41 by the cooling fan 32.

FIG. 3 illustrates that the liquid crystal panel assembly 20 is fixed to the opposite side panels 13 of the housing 10 by U-shaped coupling pieces 24. When fixing the liquid crystal panel assembly 20 to the housing 10, the liquid crystal panel 21 may be located a spacing distance "d" from the protection panel 12 and the spacing distance D1 is regulated in a range of 5 to 25 mm. If D1 is less than 5 mm, the liquid crystal panel 21 has a high risk of damage where the protection panel 12 fails due to an external impact. Alternatively, if D1 exceeds 25 mm, the protection panel 12 has a relatively high index of refraction, which may cause a problem that an image displayed by the liquid crystal panel 21 cannot be clearly viewed.

FIGS. 4 to 7 illustrate tables of maximum temperatures of the LC with respect to solar radiation at an outdoor temperature of 45° C. and flow velocity of the first channel. In particular, FIG. 4 illustrates the table when the spacing distance D1 of the first channel 41 is 0.004 m and, likewise, FIG. 5 illustrating a case that the spacing distance D1 of the first channel 41 is 0.005 m, FIG. 6 illustrating a case that the spacing distance D1 of the first channel 41 is 0.025 m and FIG. 7 illustrating a case that the spacing distance D1 of the first channel 41 is 0.03 m.

To consider that ambient temperature can reach a maximum of about 45° C. under typical outdoor environments and solar radiation generally ranges from 600 to 850 W/m2 with a maximum of about 1100 W/m2, determining the flow velocity of air in the first channel 41 is possible, which is required to prevent degradation of liquid crystals. It is generally known that the liquid crystals are degraded at temperatures above 70° C. As such, the flow velocity of air in the first channel 41 may be determined based on the above conditions.

Referring to FIGS. 4 and 5, if the first channel 41 has a spacing distance D1 of 0.004 m, the air has a maximum flow velocity of 16 m/s to prevent the degradation of liquid crystals. Likewise, if the first channel 41 has a spacing distance D1 of 0.005 m, the maximum flow velocity of air to prevent the degradation of liquid crystals is 14 m/s. Also, as illustrated in FIGS. 6 and 7, the maximum flow velocity of air required to prevent the degradation of liquid crystals is 10 m/s, which is substantially the same in cases that the first channel 41 has the spacing distance D1 of 0.025 m and 0.03 m, respectively.

However, if the spacing distance D1 of the first channel 41 is too narrow, an excessive pressure drop may occur while achieving a desired flow velocity of air. On the contrary, when the spacing distance D1 of the first channel 41 is too wide, an excessively high air flow rate may be required to achieve the desired flow velocity of air. For a common LCD device where the LCD device 21 has a size of 46 inches and the cooling fan 32 is a typical one, the spacing distance D1 of the first channel 41 may be determined by a static pressure-flow rate curve of the cooling fan 32.

Figure 8:
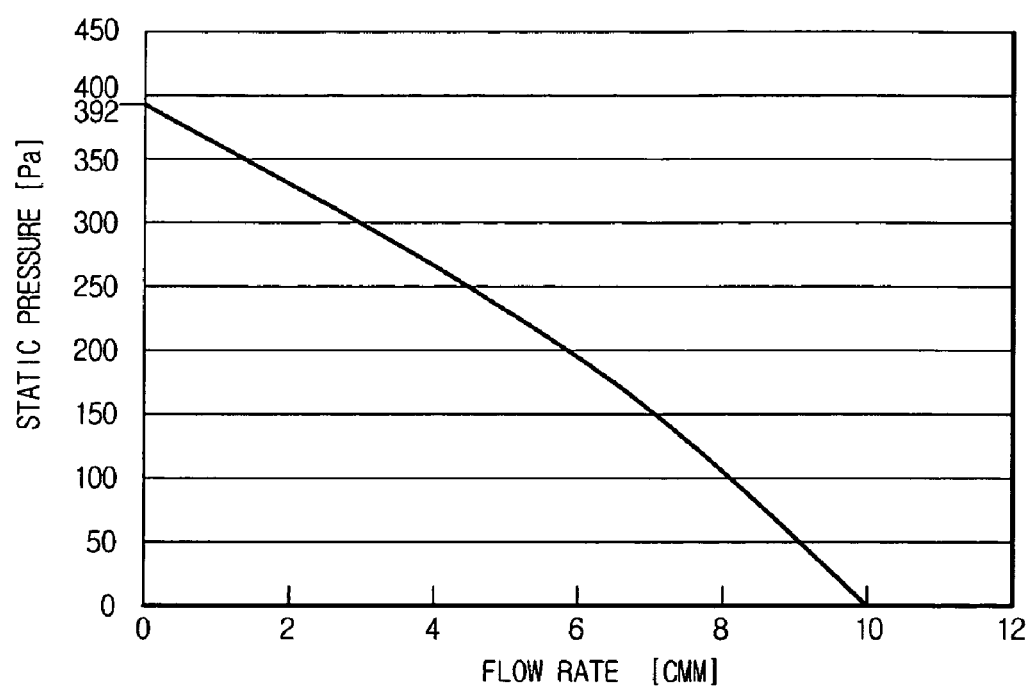
FIG. 8 is a graph illustrating a static pressure-flow rate curve of a typical cooling fan.

FIG. 8 is a graph illustrating the static pressure-flow rate curve of a typical cooling fan.

With reference to FIG. 8, the spacing distance D1 of the first channel 41 where the pressure drop is acceptable will hereinafter be described in more detail.

When the spacing distance D1 of the first channel 41 is 0.004 m, the maximum flow velocity of air required to prevent the degradation of liquid crystals is 16 m/s. Herein, the pressure drop may be calculated by the following equation 1:

$$\Delta P = f\rho(LV^2)/2D_h \quad \text{[Equation 1]}$$
$$= 622\,Pa$$

wherein f is a coefficient of friction; ρ is density; L is the length of a liquid crystal panel; V is a flow velocity; and Dh is a hydraulic diameter.

When the spacing distance D1 of the first channel 41 is 0.005 m, the maximum flow velocity of air required to prevent the degradation of liquid crystals is 14 m/s. Herein, the pressure drop may be calculated by the above equation 1, as follows.

$$\Delta P = f\rho(LV^2)/2D_h = 371\,Pa$$

Referring to FIG. 8, which illustrates the static pressure-flow rate curve of the cooling fan, in conjunction with the pressure drop obtained from equation 1, when the spacing distance D1 of the first channel 1 is 0.004 m, the pressure drop is 622 Pa which is considerably higher than the critical static pressure of the cooling fan 32, that is, 392 Pa. Alternatively, if the spacing distance d of the first channel is 0.005 m, the pressure drop is 371 Pa, which is within an effective operational range of the cooling fan 32. Accordingly, a minimum spacing distance "d1" of the channel 41 may be determined to be 0.005 m.

Next, referring to FIG. 8, a description will be given of a limitation for the flow rate of air depending on the spacing distance D1 of the first channel 41 below.

When the spacing distance D1 of the first channel 41 is 0.025 m, the maximum flow velocity required to prevent the degradation of liquid crystals is 10 m/s. Herein, a desired flow rate of air may be calculated by the following equation 2:

$$Q = VA \quad \text{[Equation 2]}$$
$$= 10 * 0.6 * 0.025$$
$$= 0.15\,m^3/s$$
$$= 9\,CMM$$

wherein V is a flow velocity, and A is a cross-sectional area.

If the spacing distance D1 of the first channel 41 is 0.03 m, the maximum flow velocity of air required to prevent the degradation of liquid crystals is 10 m/s. Herein, the desired flow rate of air may be calculated by the above equation 2, as follows.

$$Q = VA = 10*0.6*0.03 = 0.18\,m3/s = 10.8\,CMM$$

Referring to FIG. 8, which illustrates the static pressure-flow rate curve of the cooling fan, in conjunction with the flow rate of air obtained from equation 2, when the spacing distance D1 of the first channel 1 is 0.025 m, the desired flow rate is 9 CMM which is within a critical flow rate of air in the cooling fan 32, that is, 10 CMM. Alternatively, if the spacing distance D1 of the first channel is 0.03 m, the desired flow rate is 10.8 CMM over the critical flow rate described above. Accordingly, in consideration of the flow rate condition, the spacing distance D1 of the first channel 41 must be less than 0.025 m. Moreover, the critical flow rate of air in the cooling fan 32, 10 CMM, is a value only possible under free flow conditions without pressure drop. However, since the pressure drop must be considered for a real flow, for example, the first channel 41 has the maximum spacing distance "d2" of 0.025 m.

Consequently, to consider functions of the protection panel 12 as well as the static pressure-flow rate curve of the cooling fan 32, the spacing distance D1 of the first channel 41 may be defined in the range of 0.005 to 0.025 m.

The above description was given of the maximum flow velocity required to prevent the degradation of liquid crystals depending on the spacing distance D1 of the first channel 41. However, even when the LCD device is located outside, maintaining the flow velocity of air which flows through the first channel 31 at a maximum level is unnecessary. This is because outdoor air temperature is typically below 45° C. and the solar radiation is also generally less than 1100 W/m2.

Referring to FIG. 2, the LCD device of the present general inventive concept includes the flow control device 50 to regulate the flow rate of air in the cooling fan 32 based on the temperature around the liquid crystal panel assembly 20, which in turn, controls the flow velocity of air flowing through the first channel 41. That is, when the outdoor air temperature is below 45 and the solar radiation is less than 1100 W/m2 such that the maximum flow velocity is not needed, the flow control device 50 controls the cooling fan 32 to regulate the flow velocity of air in the first channel 41 to be maintained at a lower level.

The flow control device 50 includes the cooling fan 32 to blow air to the first channel 41, the temperature sensor 52 that measures the temperature of air emerging from the first channel 41, and the flow rate controller 51 that controls the cooling fan 32 according to a signal transmitted from the temperature sensor 52. The temperature sensor 52 determines the temperature when the air absorbed heat as much as possible while passing through the first to third channels 41, 42 and 43, in order. For this reason, the temperature sensor 52 may be arranged near the outlet 18 provided at the partition 16.

When the flow control device 50 imparts turbulence to air in the first channel 41, the turbulent air flow may effectively remove heat incident on the front side of the liquid crystal panel 21. Accordingly, the flow control device 50 must control the cooling fan 32 such that the air in the first channel 41 has a flow velocity required to impart turbulence to the air flow.

Thus, the following description will be given of flow velocity conditions for the first channel 2 to generate a turbulent air flow where the spacing distance D1 of the first channel 41 ranges from 0.005 to 0.025 m. It is well known that the Reynolds number is an indication index to distinguish a laminar flow from a turbulent flow in a channel and may be defined by the following equation:

$$Re = VD/v$$

wherein V is a flow velocity; D is a hydraulic diameter; and v is kinematic viscosity.

Flows with a Reynolds number of not more than 2300 are defined as laminar and, if the Reynolds number exceeds 2300, the flow may be considered turbulent.

FIG. 9 illustrates a table of Reynolds numbers with respect to different flow velocities of air in the first channel depending on the spacing distance of the first channel.

With reference to FIG. 9, achieving a minimum flow velocity of air sufficient to generate a turbulent flow is possible. Also, the flow velocity of air must be at least 4 m/s in order to generate a turbulent flow, where the channel has the spacing distance of 0.005 m. As a result, the minimum flow velocity may be assumed to be 4 m/s, which is required to reduce the solar radiation incident on the front side of the liquid crystal panel 21 using the turbulent flow. Therefore, the flow rate controller 51 in the flow control device 50 must regulate the flow rate of air in the cooling fan 32 such that the air in the first channel 41 has a controlled flow velocity of at least 4 m/s.

Consequently, the flow control device 50 may control the cooling fan 32 to maintain the flow velocity of at least 4 m/s such that a turbulent flow is generated in the channel 41, while regulating the flow velocity up to a maximum value of 14 m/s required to prevent degradation of liquid crystals. In this case, the temperature sensor 52 measures the temperature of the air having passed through all of the first to third channels 41, 42 and 43, and the flow rate controller 51 regulates the flow rate of air in the cooling fan 32 according to a signal transmitted from the temperature sensor 52 such that the air in the first channel 41 has a flow velocity ranging from 4 m/s to 14 m/s.

Figure 10:
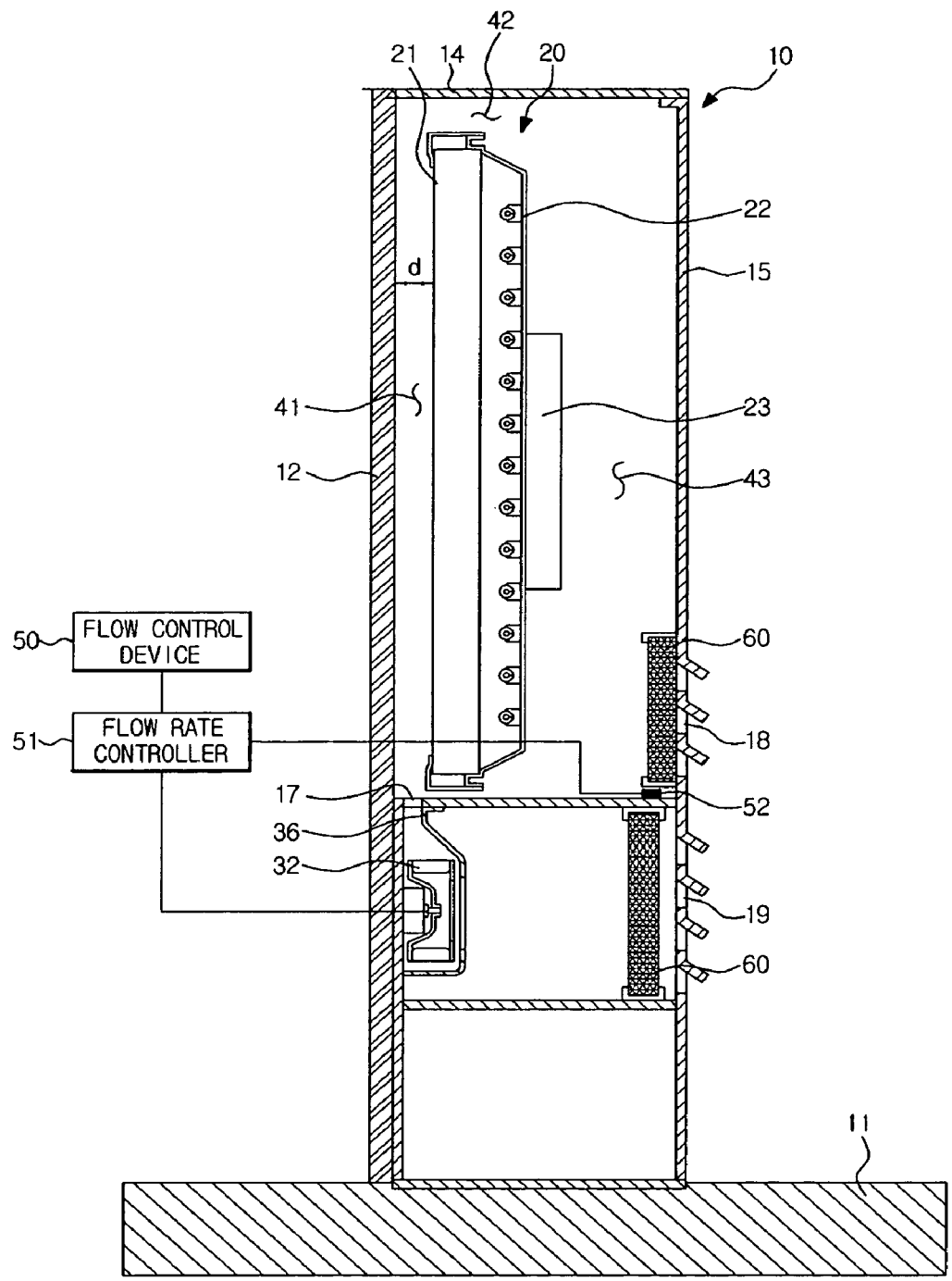
FIG. 10 is a cross sectional view illustrating a liquid crystal display device according to another embodiment of the present general inventive concept.

FIG. 10 is a cross sectional view illustrating a liquid crystal display device according to another embodiment of the present general inventive concept.

The LCD device illustrated in FIG. 10 is substantially identical to that illustrated in FIG. 2, except that the air conditioner 30 is omitted. Since the incident heat on the front side of the liquid crystal panel 21 is mostly removed by the turbulent flow flowing through the first channel 41, the LCD device illustrated in FIG. 10 does not include any additional air conditioner 30 (see FIG. 2).

With regard to an air flowing structure in the housing 10, air flows through an opening 19 formed through the rear panel 15 into the cooling fan 32. After dust filters 60 filter foreign materials from the air, the cooling fan 32 passes the filtered air through the air inlet 17. Following this, the air sequentially flows through the first, second and third channels 41, 42 and 43. The air removes heat incident on the front side of the liquid crystal panel 21 while passing through the first channel 41. Alternatively, the air also removes heat generated from the BLU 22 and the circuit board 23 during passage through the third channel 43. Thereafter, the air is discharged through the air outlet 18 out of the housing 10.

Similarly to the LCD device illustrated in FIG. 2, the LCD device illustrated in FIG. 10 also has the flow control device 50 to impart turbulence to the air in the first channel 41. The flow control device 50 includes the cooling fan 32 to blow air to the first channel 41, the flow rate controller 51 that regulates the flow rate of air in the cooling fan 32 to control the flow velocity of air in the first channel 41, and the temperature sensor 52 that measures temperature of the air having passed through the first channel 41 and sends the resulting signal to the flow rate controller 51.

In this regard, the first channel is located a spacing distance D1 in the range of 0.005 to 0.025 m, and the flow rate controller 51 controls the cooling fan 32 to maintain the flow velocity of air in the first channel 41 in the range of 4 to 14 m/s.

Such conditions, that is, the spacing distance D1 of the first channel 41 and the flow velocity of the air in the first channel 41 have been described with reference to FIGS. 4 to 9, therefore, no further detailed description of the same conditions will be given.

Although various embodiments of the present general inventive concept have been illustrated and described, it would be appreciated by those skilled in the art that changes may be made in these embodiments without departing from the principles and spirit of the general inventive concept, the scope of which is defined in the claims and their equivalents.

What is claimed is:

1. A liquid crystal display device, comprising:
   a liquid crystal panel;
   a protection panel separated from the liquid crystal panel by a channel;
   a flow control device to impart turbulence to an air flow in the channel, the flow control device comprising:
      a temperature sensor to measure the temperature of air discharged from the channel; and
      a flow rate controller to control air flow through the channel according to the measured temperature.

2. The liquid crystal display device according to claim 1, wherein the channel comprises:
   an air inlet to guide air into the channel; and
   an air outlet to discharge air from the channel.

3. The liquid crystal display device according to claim 2, wherein the flow control device further comprises a fan to force air through the channel,
   wherein the flow rate controller controls the fan according to the detected temperature.

4. The liquid crystal display device according to claim 3, wherein:
   the flow rate controller controls fan such that the air in the channel has a velocity in a range of 4 to 14 m/s.

5. The liquid crystal display device according to claim 2, further comprising dust filters disposed in the air inlet and the air outlet.

6. The liquid crystal display device according to claim 1, wherein:
   the width of the channel is in a range of 5 to 25 mm.

7. The liquid crystal display device according to claim 1, further comprising:
   a housing enclosing the liquid crystal panel,
   wherein the protection panel is made of a transparent material and is entirely located at a front side of the housing.

8. The liquid crystal display device according to claim 1, further comprising:

a backlight unit and a circuit board, both provided at a rear side of the liquid crystal panel; and a rear panel spaced apart from the backlight unit and the circuit board, wherein the air discharged from the channel flows through another channel to remove heat from the backlight unit and the circuit board.

9. A liquid crystal display device, comprising:

a liquid crystal panel;

a protection panel arranged a predetermined distance from the liquid crystal panel; and a flow control device to detect temperature variation caused by heat incident on a front side of the liquid crystal panel, and to control a flow rate of air blowing toward a channel, which is defined between the liquid crystal panel and the protection panel.

10. The liquid crystal display device according to claim 9, wherein:

the flow control device has a flow rate controller to regulate the flow rate of the air such that air in the channel has a flow velocity of not less than 4 m/s when the channel defined between the liquid crystal panel and the protection panel has a spacing distance in a range of 5 to 25 mm.

11. The liquid crystal display device according to claim 10, wherein:

the flow control device further includes a temperature sensor to detect a temperature variation of the air having passed through the channel, and the flow rate controller is operated according to a signal transmitted from the temperature sensor.

12. A display device, comprising:

a liquid crystal panel to display an image;

a protection panel to protect the liquid crystal panel; and a channel formed between the liquid crystal panel and the protection panel to pass air therebetween to remove heat from a front side of the liquid crystal panel, wherein a distance between the liquid crystal panel and the protection panel is in a range of 5 mm to 25 mm.

13. A display device, comprising:

a liquid crystal panel to display an image;

a protection panel to protect the liquid crystal panel;

a channel formed between the liquid crystal panel and the protection panel; and a flow control device to control the flow rate of air in the channel to remove heat from a front side of the liquid crystal panel, the flow control device comprising:

a fan to force air through the channel;

a temperature sensor to measure the temperature of air discharged from the channel; and a flow rate controller control the fan according to the measured temperature to regulate the flow rate of the air in the channel.

14. The display device according to claim 13, wherein the width of the channel is determined by a static pressure-flow rate curve of the fan.

15. The display device according to claim 13, further comprising:

an air conditioner to supply cooled air to the fan.

* * * * *